United States Patent [19]
Yoon

[11] Patent Number: 6,051,784
[45] Date of Patent: *Apr. 18, 2000

[54] SEMICONDUCTOR PACKAGE

[75] Inventor: Suck-Jun Yoon, Puch'on, Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/986,896

[22] Filed: Dec. 8, 1997

[30] Foreign Application Priority Data

Dec. 10, 1996 [KR] Rep. of Korea ...................... 96-63508

[51] Int. Cl.⁷ ....................................... H05K 5/06
[52] U.S. Cl. .......................... 174/52.3; 257/691; 693/703
[58] Field of Search .................. 174/52.3, 52.4; 257/691; 693/703; 704/672; 361/807

[56] References Cited

U.S. PATENT DOCUMENTS

| | | | |
|---|---|---|---|
| 4,814,943 | 3/1989 | Okuaki | 361/400 |
| 4,833,102 | 5/1989 | Byrne et al. | 437/218 |
| 5,568,684 | 10/1996 | Wong | 29/840 |
| 5,689,089 | 11/1997 | Polak et al. | 174/52.4 |

FOREIGN PATENT DOCUMENTS

| | | |
|---|---|---|
| 4-239157 | 8/1992 | Japan. |
| 8-125065 | 5/1996 | Japan. |

*Primary Examiner*—William A. Cuchlinski, Jr.
*Assistant Examiner*—Ronnie Mancho
*Attorney, Agent, or Firm*—Ware, Fressola, Van Der Sluys & Adolphson LLP

[57] ABSTRACT

Disclosed herein is a semiconductor package having a wire bonding structure. The semiconductor package includes a packaging substrate having a multi-stepped opening extending to a selected depth from the surface of the substrate. The area of the opening decreases as the level from the upper surface decreases. The substrate also includes: a die attach region positioned at the lowest bottom plane of the multi-stepped opening, on which the semiconductor chip is attached; a step plane formed at the upper step plane over the die attach region, on which a plurality of first interconnections for signal transfer paths are printed; and a plurality of outer leads electrically connected to the plurality of first interconnections the plurality of alter leads, projected outwards from the packaging substrate. There is also provided in the package a connecting member having a through hole at its central portion and a plurality of second interconnections at its circumference. The interconnections are insulated from another one. The connecting member is mounted on the step plane of the packaging substrate.

9 Claims, 2 Drawing Sheets

SEMICONDUCTOR PACKAGE

BACKGROUND OF THE INVENTION

1. Field of the Invention

The present invention generally relates to a semiconductor package, and more particularly to a semiconductor package having a wire bonding structure for electrical connection between bonding pads of a semiconductor chip and leads of a lead frame.

2. Description of the Related Art

In the electronic industry, integrated circuits are commonly encased within packages made of plastic or ceramic.

A ceramic integrated circuit package comprises a ceramic substrate including contact pins to connect an integrated circuit enclosed in the package to external circuitry. The package is hermetically sealed with a ceramic lid.

So as to fabricate a ceramic integrated circuit package, a number of steps for properly adhering conductive metal patterns and contact pins to the ceramic package are required. Such metal patterns and contact pins serve to provide electrical paths between external circuitry and the integrated circuit encapsulated within the ceramic package.

Typically, a metal such as tungsten is used to form metallic wire bonding areas, die attach area, and external bonding pads on the ceramic substrate.

In order to provide corrosion resistance, it is highly desirable to coat or plate wire bonding areas, die attach area, and external bonding pads with a material such as tungsten.

FIG. 1 is a perspective view of a semiconductor package according to the background art.

Referring to FIG. 1, a ceramic package has signal transfer paths from a semiconductor chip 1 to external circuits(not shown), which consist of bonding pads 1a, wires 2, inner leads 3 and outer leads 4.

So as to form the signal transfer paths, one group of terminals of respective wires 2 are connected to the corresponding inner leads 3 by soldering and the other group of terminals of wires 2 thereof are also connected to the bonding pads of the semiconductor chip 1 by soldering.

However, the inner leads 3 are put on a plane of almost the same level as the bonding pads, and the bonding wires have a convex curved shape. Therefore, when chip size becomes larger depending on the increase in the integrity, wire length increases. As a result, the semiconductor package may induce a problem that bonding wires droop. Since the drooping wires may contact with each other, their signal transfer paths may come to be in an unstable state.

SUMMARY OF THE INVENTION

Accordingly, it is an object of the present invention to provide a semiconductor package capable of preventing confusion in signal transfer paths due to the contacts between adjacent wires regardless of chip size.

To accomplish the above object and other objects, the semiconductor package includes a packaging substrate having a semiconductor chip. The semiconductor chip has a plurality of bonding pads formed thereon. The packaging substrate has an opening formed at a central portion thereof. The opening includes a bottom plane on which the semiconductor chip is mounted and a stepped plane in which a plurality of first interconnections for signal transfer paths are formed. The opening has a stepped structure in which an area of the opening or hole expands as the opening changes from the bottom plane to the stepped plane. The packaging substrate has a plurality of outer leads which extend from the stepped plane through an internal portion to an exterior thereof. A connecting member is mounted on the stepped plane of the packaging substrate. The connecting member includes a through hole at a central portion thereof and a circumferential portion thereof in which a plurality of second interconnections are electrically connected with the first interconnections of the stepped plane, respectively. Moreover, the second interconnections of the connecting member and bonding pads of the semiconductor chip are electrically connected to each other through the through hole of the connecting member by a plurality of wires. Preferably, the opening of the semiconductor substrate is covered with a shielding lid so as to prevent the introduction of a foreign impurity material within the package.

BRIEF DESCRIPTION OF THE DRAWINGS

These and other features, aspects, and advantages of the present invention will become better understood with reference to the following description, appended claims, and accompany drawings, wherein

DETAILED DESCRIPTION OF THE PRESENT INVENTION

Hereinafter, a preferred embodiment of the present invention will be described with reference to the accompanying drawings.

Figure 1:
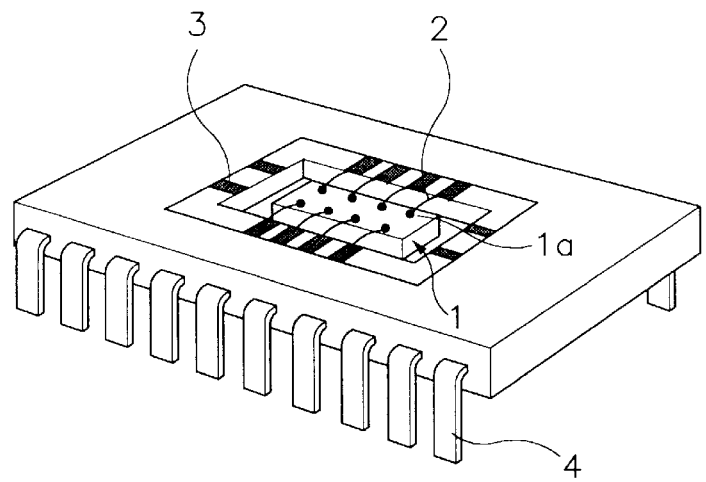
FIG. 1 is a perspective view of a semiconductor package in accordance with a conventional art.
Figure 2:
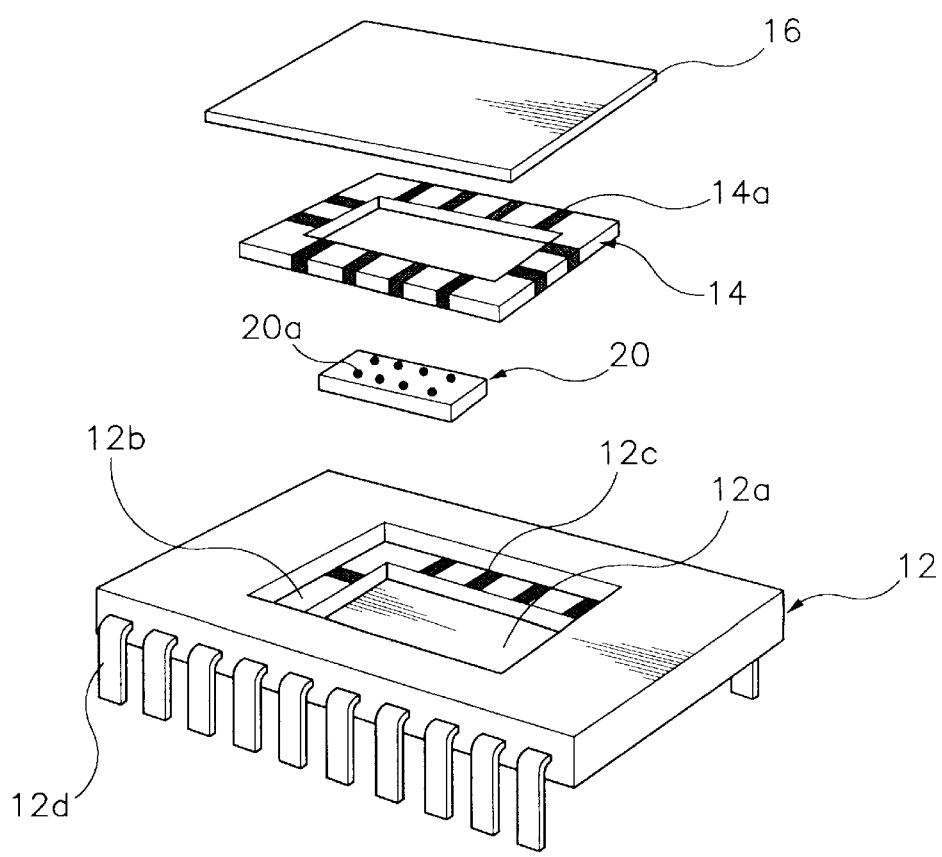
FIG. 2 is an exploded perspective view of a semiconductor package in accordance with a embodiment of the present invention.
Figure 3:
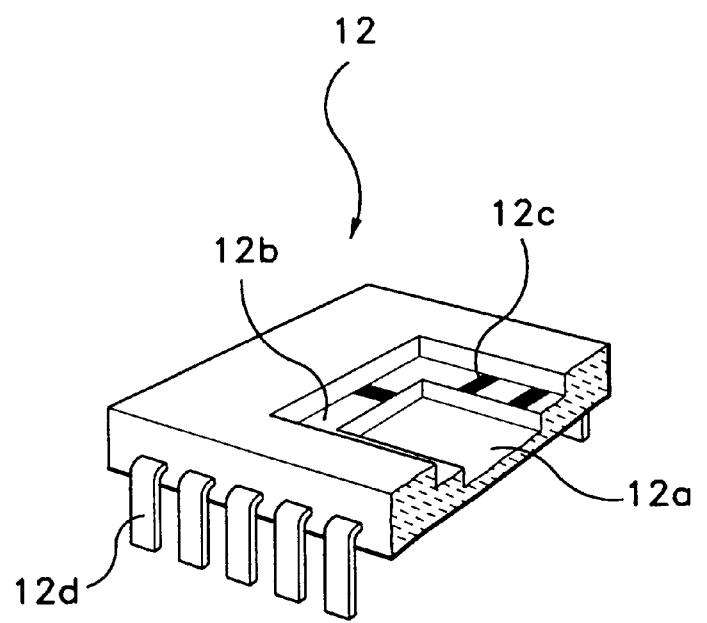
FIG. 3 is a partial sectional perspective view of a packaging substitute shown in FIG. 2.
Figure 4:
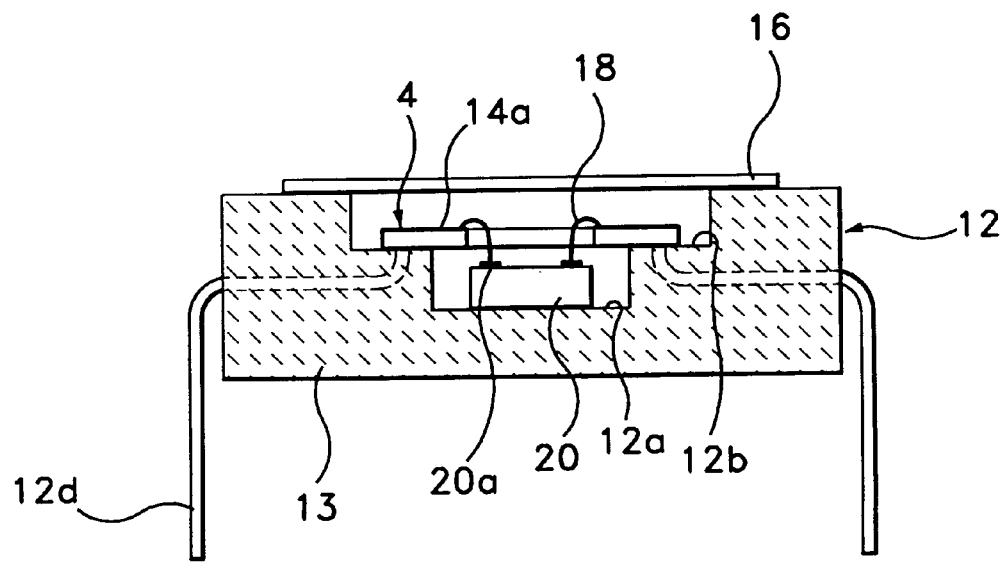
FIG. 4 is a sectional view of the assembled package according to this embodiment in this invention FIG. 2.

FIG. 2 is an exploded perspective view of a semiconductor package in accordance with one embodiment of the present invention and FIG. 3 is a partial sectional view of a packaging substrate shown in FIG. 2. FIG. 4 is a sectional view of the assembled package according to this embodiment in this invention FIG. 2.

Referring to FIGS. 2 and 3, there is provided a semiconductor chip 20 having a plurality of bonding pads 20a thereon. The semiconductor chip 20 is mounted on a packaging substrate 12 made of ceramic. The packaging substrate 12 has a stepped opening region at a central portion thereof. The stepped opening of the packaging substrate 12 includes a bottom plane 12a and a stepped plane 12b. The area of the opening expands as the opening changes from the bottom plane 12a to the stepped plane 12b. The semiconductor chip 20 is mounted on the bottom plane 12a of the opening. Hereinafter, the bottom plane 12a of the opening will be referred as a chip attachment region. The stepped plane 12b formed over the die attachment region 12a has a plurality of first interconnections 12c printed in relief(emboss) or intaglio manner thereon. A plurality of outer leads 12d electrically connected to the corresponding plurality of first interconnections 12c are formed from the stepped plane 12b through the internal portion of the package substrate 12 to the exterior of the (packaging substrate 12. On the stepped plane 12b is mounted a connecting member having a through hole at a central portion thereof. At the circumferential portion of the connecting member 14, are also printed in a relief or intaglio manner a plurality of second inteconnections 14a, each of which is insulated from each other. As shown in FIG. 4, a plurality of wires 18 for electrically connecting bonding pads 20a of the semiconductor chip 20 with the second interconnections 14a of the connecting member 14 are formed through the tetragonal through hole of the connecting member 14. The opening of the semiconductor substrate 12 is covered with a sealing lid 16 in a hermetically seal state. So as to confirm the bonded state of the wires from the exterior, the sealing lid 16 is preferable to be made of a transparent material. Alternatively, the opening of the semiconductor substrate 12 is filled with a sealant material.

The connecting member 14 can be made of FR 4 as well as ceramic material. And, in order to provide corrosion resistance for the second interconnections 14a formed in the circumferential portion of the connecting member 14, it is highly desirable to use the second interconnections 14a made of a copper layer plated with a gold(Au) layer or a silver (Ag) layer. In a case where the distance between the chip attachment region 12a and the stepped plane 12b is very low, the upper face of the chip 20 will come to be in contact with the bottom face of the connecting member 14, and in case that the distance is very high, the appearance of the package is not good.

Hereinafter, an assembly process of the ceramic package type semiconductor device will be described with reference to the drawings.

First, the connecting member 14, the packaging substrate 12 and the semiconductor chip 20 respectively are prepared. The semiconductor chip 20 is put on the chip attachment region 12a and is then aligned. A portion of the connecting member 14 is put on the stepped plane and is then aligned with a remaining portion jutting out and extending over the bottom plane 12a. Following the alignment of the semiconductor chip 20 and the connection member 14, the semiconductor substrate 12 and the connecting member 14 are attached to each other in a mechanical or a chemical method such as a thermal fusion on welding method. Thereafter, as shown in FIG. 4, the bonding pads 20a of the semiconductor chip 20 are electrically connected with the interconnections 14a of the connecting member 14 by a plurality of wires 18. One of the ends of the wires 18 are connected to the interconnections 14a of the connecting member 14 and the other ends of the wires 18 are connected to the bonding pads 20a through the through hole of the connecting member 14. The wires 18 are formed in the shape shown in FIG. 4 so that each rises vertically from a respective bonding pad, through the tetragonal hole, and with a bend or slight loop onto a corresponding remaining portion of a respective second interconnection that extends over the bottom plane. Lastly, so as to prevent the introduction of the impurities into the opening of the packaging substrate 12, the hole thereof is covered with the sealing lid 16.

As described previously, the present invention can solve a problem where the wires droop and come into contact with each other, since the die attachment region and the stepped plane on which the connecting member is mounted are located such that a height difference between them is formed. The present invention also stabilizes signal transfer paths between the semiconductor chip and external circuits.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be affected without departing from the spirit and scope of the invention as described and claimed.

What is claimed is:

1. A semiconductor package comprising:
    a semiconductor chip on which a plurality of bonding pads are formed;
    a packaging substrate having a stepped hole, said stepped hole including a bottom plane and a stepped plane, an area of the stepped hole expanding as the stepped hole changes from the bottom plane to the stepped plane, the semiconductor chip being mounted on the bottom plane and the stepped plane having a plurality of first interconnections for signal transfer paths printed thereon, the packaging substrate having a plurality of outer leads which extend from the first interconnections of the stepped plane through an internal portion of the substrate to an exterior of the substrate so as to form signal transfer paths;
    a connecting member having a through hole at a central portion thereof and a plurality of second interconnections formed at a circumferential portion thereof, a portion of the connecting member being mounted on the stepped plane of the packaging substrate and a remaining portion of the connecting member extending over the bottom plane of the stepped hole of the packaging substrate; and
    a plurality of wires for electrically connecting bonding pads of the semiconductor chip with corresponding portions of the second interconnections which are located on the remaining portion of the connecting member via the through hole of the connecting member.

2. The semiconductor package as claimed in claim 1, further comprising a sealing lid for enclosing the hole of the packaging substrate.

3. The semiconductor package as claimed in claim 1, wherein the connecting member comprises ceramic.

4. The semiconductor package as claimed in claim 1, wherein the first interconnections of the packaging substrate are printed in a relief manner.

5. The semiconductor package as claimed in claim 1, wherein the first interconnections of the package substrate are printed in an intaglio manner.

6. The semiconductor package as claimed in claim 1, wherein the second interconnections of the connecting member are printed in a relief manner.

7. The semiconductor package as claimed in claim 1, wherein the second interconnections of the connecting member are printed in an intaglio manner.

8. The semiconductor package as claimed in claim 4, wherein the second interconnections have a double layered structure having a copper layer and a gold layer plated on the copper layer.

9. The semiconductor package as claimed in claim 4, wherein the second interconnections have double layered structure having a copper layer and a silver layer plated on the copper layer.

* * * * *

UNITED STATES PATENT AND TRADEMARK OFFICE
CERTIFICATE OF CORRECTION

PATENT NO. : 6,051,784
DATED : April 18, 2000
INVENTOR(S) : S. Yoon

It is certified that error appears in the above-indentified patent and that said Letters Patent is hereby corrected as shown below:

On the title page,

[57], line 14, please cancel "the plurality of alter leads," and substitute --, the plurality of outer leads-- therefor.

At col. 2, line 29, please cancel "substitute" and substitute --substrate-- therefor; and at line 63, please cancel the "(" prior to "packaging".

At col. 3, line 36, please cancel "connection" and substitute --connecting-- therefor; and at line 39, after "fusion", please cancel "on" and substitute --or-- therefor.

Signed and Sealed this

Twentieth Day of March, 2001

Attest:

NICHOLAS P. GODICI

*Attesting Officer*    *Acting Director of the United States Patent and Trademark Office*